United States Patent [19]
Yoshida

[11] Patent Number: 5,974,063
[45] Date of Patent: Oct. 26, 1999

[54] METHOD AND APPARATUS FOR DRIVING LASER DIODE IN WHICH DETERIORATION OF EXTINCTION RATIO IS PREVENTED

[75] Inventor: Toshiro Yoshida, Tokyo, Japan

[73] Assignee: NEC Corporation, Tokyo, Japan

[21] Appl. No.: 08/964,147

[22] Filed: Nov. 6, 1997

[30] Foreign Application Priority Data

Nov. 12, 1996 [JP] Japan .................................. 8-300285

[51] Int. Cl.⁶ .................................................. H01S 3/103
[52] U.S. Cl. .................................. 372/38; 372/29; 372/31
[58] Field of Search .................................. 372/38, 29, 31

[56] References Cited

U.S. PATENT DOCUMENTS

| | | | |
|---|---|---|---|
| 4,369,525 | 1/1983 | Breton et al. | 455/618 |
| 4,803,497 | 2/1989 | Kennedy, Jr. et al. | 346/108 |
| 5,175,722 | 12/1992 | Minami et al. | 369/116 |
| 5,197,059 | 3/1993 | Minami et al. | 369/116 |
| 5,535,038 | 7/1996 | Hinch | 359/180 |
| 5,732,096 | 3/1998 | Suzuki et al. | 372/38 |
| 5,778,017 | 7/1998 | Sato et al. | 372/31 |
| 5,793,786 | 8/1998 | Furumiya | 372/38 |
| 5,796,767 | 8/1998 | Aizawa | 372/38 |
| 5,832,012 | 11/1998 | Araki et al. | 372/24 |
| 5,850,409 | 12/1998 | Link | 372/38 |

FOREIGN PATENT DOCUMENTS

| | | |
|---|---|---|
| 61-52042 | 3/1986 | Japan . |
| 62-45085 | 2/1987 | Japan . |
| 3 24830 | 2/1991 | Japan . |
| 3-209890 | 9/1991 | Japan . |
| 4-276673 | 10/1992 | Japan . |
| 4-290483 | 10/1992 | Japan . |
| 5-218553 | 8/1993 | Japan . |
| 5-82066 | 11/1993 | Japan . |

*Primary Examiner*—James W. Davie
*Attorney, Agent, or Firm*—Whitham, Curtis & Whitham

[57] ABSTRACT

In the apparatus for driving a laser diode, a light receiving element detects a light output level of the laser diode to produce an electric signal. That is, the light receiving element detects a first electric signal when the laser diode is driven based upon an ON signal, and a second electric signal when the laser diode is driven based upon an OFF signal. A control circuit outputs a control signal in response to the signal. A driving circuit drives the laser diode in response to the control signal such that a difference between the first electric signal and the second electric signal is maintained at a constant value.

19 Claims, 4 Drawing Sheets

METHOD AND APPARATUS FOR DRIVING LASER DIODE IN WHICH DETERIORATION OF EXTINCTION RATIO IS PREVENTED

BACKGROUND OF THE INVENTION

1. Field of the Invention

The present invention generally relates to a laser diode driving method and a laser diode driving apparatus, which are used in an optical digital transmitter. More specifically, the present invention is directed to a laser diode driving method and a laser diode driving apparatus, in which deterioration of extinction ratio is prevented.

2. Description of the Related Art

To avoid the pattern effect caused by delay in laser light emission from a laser diode, a very small bias current which is lower than a threshold current value of the laser diode is generally supplied to the laser diode. As is known in this field, however, when the bias current exceeds the threshold value, the extinction ratio of the laser diode is rapidly deteriorated, resulting in a failure of signal transmission.

One of conventional bias current control examples is disclosed in, for instance, Japanese Laid-open Patent Application Disclosure (JP-A-Heisei 4-290483). This conventional bias current control example will now be described with reference to FIG. 1.

In FIG. 1, a time constant unit 34 produces a control signal Va in response to a mark ratio of a modulation signal "Vs", namely, a ratio of "1" to "0" contained in the signal. A shunting device 35 separates current "Io" supplied from a current source 36 into current Idc and current Ipo. Then, the current Idc is supplied to an adding unit 32, and the current Ipo is supplied to a driving unit 31. At this time, the shunting device 35 changes a shunt ratio of the current Idc to the current Ipo in response to the control signal Va.

That is, when the mark ratio of the modulation signal Vs is small, the shunt ratio is determined in such a manner that the current Idc is increased for a laser diode 33 subsequent to the adding unit 32. On the other hand, when the mark ratio is large, the shunting device 35 increases the ratio of the current Ipo to the current Idc. It should be noted that the following relationship should be satisfied: Ipo+Idc=Io, i.e., constant. The adding unit 32 adds the current Ip derived from the driving unit 31 to the current Idc derived from the shunting device 35 to produce a current ILd, and then supplies the current ILd to the laser diode 33. As described above, in the conventional example, the pattern effect can be prevented by detecting the mark ratio of the modulation signal Vs and then by changing the ratio of the current Idc to the current Ipo based on the detected mark ratio.

Next, another conventional laser diode driving circuit, which is described in Japanese Laid-open Patent Application Disclosure (JP-A-Heisei 3-24830), will be described with reference to FIG. 2. As represented in FIG. 2, a laser diode driving circuit 43 is composed of differential transistors 43-1 and 43-2, and constitutes a differential amplifier for driving a laser diode 46 in response to an input signal 41 together with a transistor 43-3. The pulse current control circuit 44 controls a drive current for the laser diode 46 to be increased/decreased in accordance with the light signal intensity from the laser diode 46 detected by a monitoring photodiode 47.

That is, the transistor 43-3 controls the drive current Ip in response to a signal 45 supplied from the pulse current control circuit 44. As described above, in this laser diode driving circuit 43, the laser diode 46 emits light in response to only the pulse current Ip without any bias current. Thus, the deterioration in the extinction ratio of the laser diode 46 can be prevented.

However, there is a problem in the above-explained laser diode driving circuit shown in FIG. 1. That is, when the mark ratio of the modulation signal is small, the current Idc is increased. Accordingly, there is a possibility that the extinction ratio will be deteriorated.

On the other hand, in another conventional laser diode driving circuit shown in FIG. 2, the laser diode is driven only by the pulse current without any DC bias current. As a result, when the data rate of an input signal becomes high, the pattern effect is caused, resulting in jitter phenomenon in a light output signal from the laser diode 46. As a consequence, the signal transmission quality is deteriorated.

SUMMARY OF THE INVENTION

The present invention has been made to solve the above-described problems. Therefore, an object of the present invention is to provide a laser diode driving method and an apparatus for driving a laser diode, in which deterioration of an extinction ratio of a laser diode is prevented.

Another object of the present invention is to provide a laser diode driving method and an apparatus for driving a laser diode, in which the generation of a pattern effect can be suppressed.

In order to achieve an aspect of the present invention, an apparatus for driving a laser diode includes a light receiving element for detecting a light output level from the laser diode to produce an electric signal, wherein the light receiving element producing a first electric signal from the light output level from the laser diode driven based upon an ON signal, and a second electric signal from the light output level from the laser diode driven based upon an OFF signal, a control circuit for outputting a control signal in response to the first and second electric signals, and a driving circuit for driving the laser diode in response to the control signal such that the first electric signal and the second electric signal maintains at substantially constant values, respectively.

In this case, the control circuit outputs first and second control signal as the control signal in response to the first and second electric signals. When the driving circuit first and second driving circuits, the first driving circuit drives the laser diode in response to the first control signal such that a difference between the first electric signal and the second electric signal is maintained at a substantially constant value, and the second driving circuit drives the laser diode in response to the second control signal such that the second electric signal is maintained at a substantially constant value. The control circuit may include a light output control circuit for comparing the first electric signal with a reference signal to output the second control signal based on the comparing result.

Also, the control circuit may include a circuit for outputting first and second light output detection signals as the control signal from the first and second electric signals from the light receiving element, respectively. In this case, the driving circuit includes a circuit for comparing the first light output detection signal with the second light output detection signal to produce the comparing result, and controls a magnitude of drive current supplied to the laser diode based on the comparing result. Also, the control circuit outputs the first light output detection signal based on a maximum value of the first electric signal and the second light output detection signal based on a maximum value of the second electric signal. In this case, the control circuit includes a first light output detecting circuit and a second light output detecting circuit. The first light output detecting circuit includes a first transistor which is turned ON when the first electric signal is inputted to the first transistor, and which is turned OFF when the second electric signal is inputted to the first transistor, and a first RC circuit connected to the first transistor, and composed of a first resistor and a first capacitor connected in parallel, the first capacitor being charged and discharged when the first transistor is turned ON and OFF, respectively, to output the first light output detection signal based on the maximum value of the first electric signal. The second light output detecting circuit includes a second transistor which is turned ON when the second electric signal is inputted to the first transistor, and which is turned OFF when the first electric signal is inputted to the first transistor, and a second RC circuit connected to the second transistor, and composed of a second resistor and a second capacitor connected in parallel, the second capacitor being charged and discharged when the second transistor is turned ON and OFF, respectively, to output the second light output detection signal based on the maximum value of the second electric signal.

In order to achieve another aspect of the present invention, an apparatus for driving a laser diode includes a light receiving element for detecting a light output level of the laser diode to produce an electric signal, wherein the light receiving element detects a first electric signal when the laser diode is driven based upon an ON signal, and a second electric signal when the laser diode is driven based upon an OFF signal, a high level data producing unit for converting a data corresponding to the first electric signal into a high level data in accordance with a setting ratio, wherein the setting ratio is set in relation to an extinction ratio of the laser diode, a low level data producing unit for producing a low level data from the second electric signal, a control circuit for comparing the high level data with the low level data to output a control signal based on the comparing result, and a driving circuit for driving the laser diode in response to the control signal such that a difference between the first electric signal and the second electric signal is maintained at a constant value.

In order to achieve still another aspect of the present invention, an apparatus for driving a laser diode includes a light receiving element for detecting a light output level of the laser diode to produce an electric signal, wherein the light receiving element detects a first electric signal when the laser diode is driven based upon an ON signal and detects a second electric signal when the laser diode is driven based upon an OFF signal, a first light output detecting circuit for outputting a first light output detection signal from the first electric signal, a second light output detecting circuit for outputting a second light output detection signal from the second electric signal, and a driving circuit for comparing the first light output detection signal with the second light output detection signal to produce the comparing result, and for controlling a magnitude of drive current supplied to the laser diode based on the comparing result such that a difference between the first electric signal and the second electric signal is maintained at a substantially constant value.

In order to yet still another aspect of the present invention, a method for driving a laser diode, includes the steps of:

detecting a light emitted from the laser diode when the laser diode is driven based on a signal including an ON data signal and an OFF data signal, to produce an electric signal, the signal;

outputting first and second control signal in response to the electric signal such that light intensity levels from the laser diode for the ON data signal and OFF data signal have predetermined levels, respectively; and driving the laser diode in response to the first and second control signal.

BRIEF DESCRIPTION OF THE DRAWINGS

More complete understanding of the teachings of the present invention may be acquired by referring to the accompanying drawings, in which.

DESCRIPTION OF THE PREFERRED EMBODIMENTS

Figure 1:
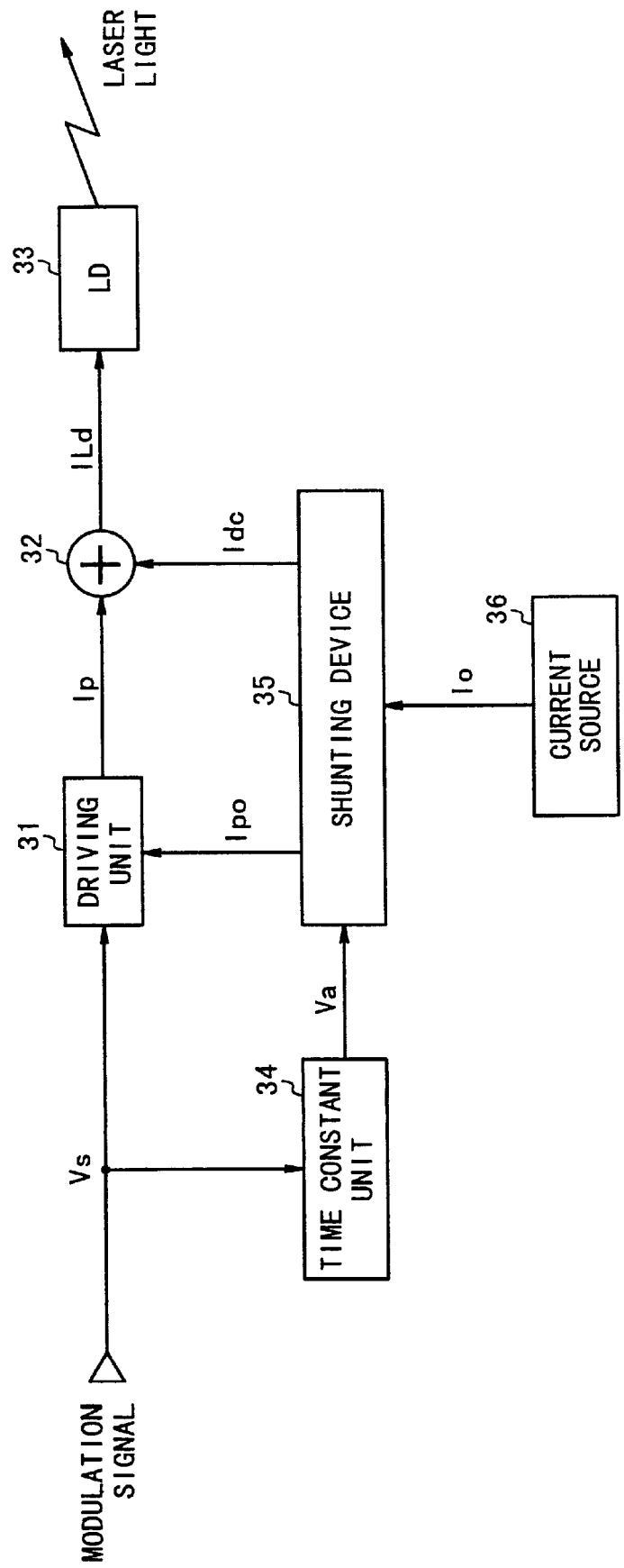
FIG. 1 is a schematic block diagram the structure of a first conventional laser diode driving circuit.
Figure 2:
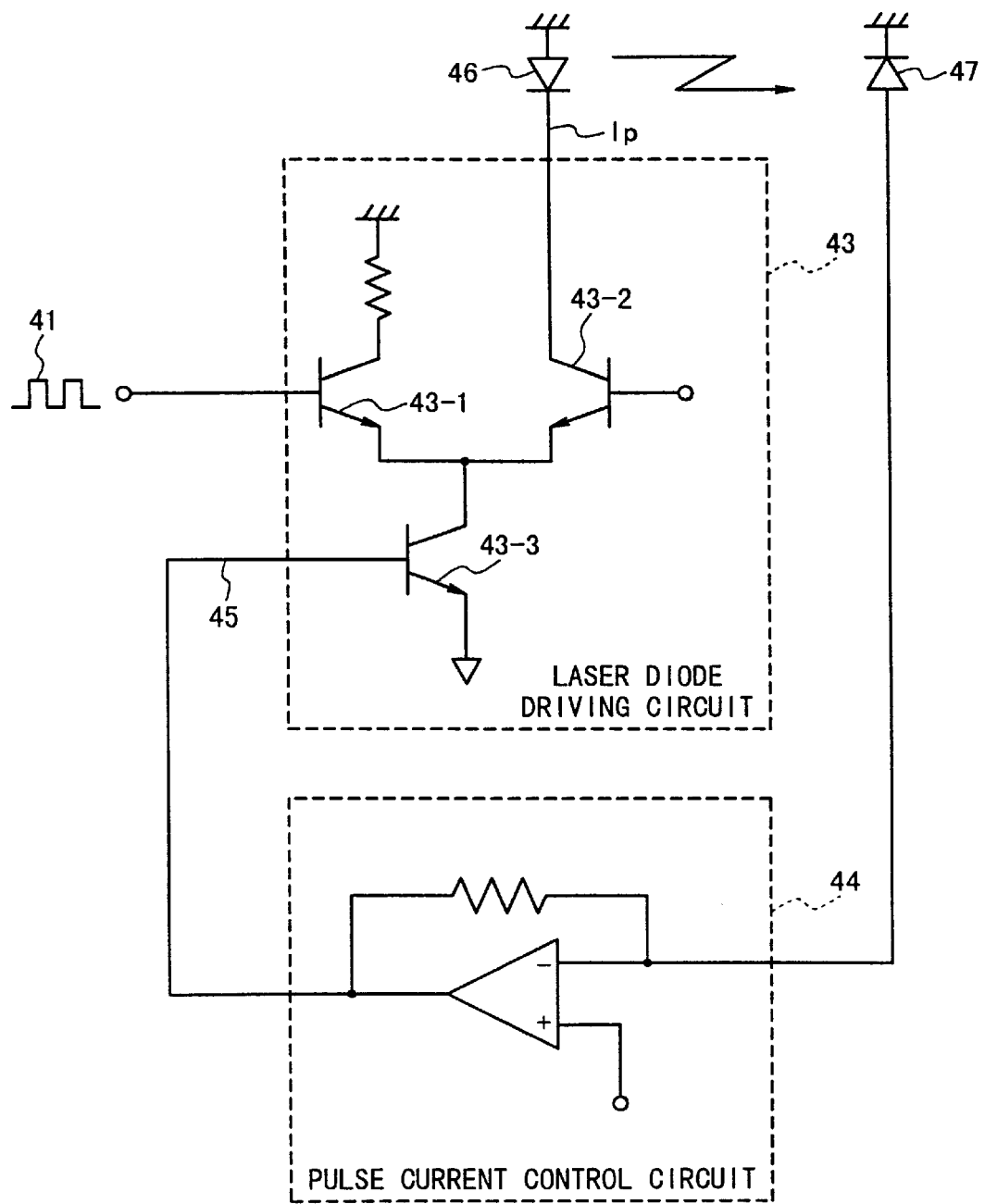
FIG. 2 is a circuit diagram illustrating the structure of a second conventional laser diode driving circuit.
Figure 3:
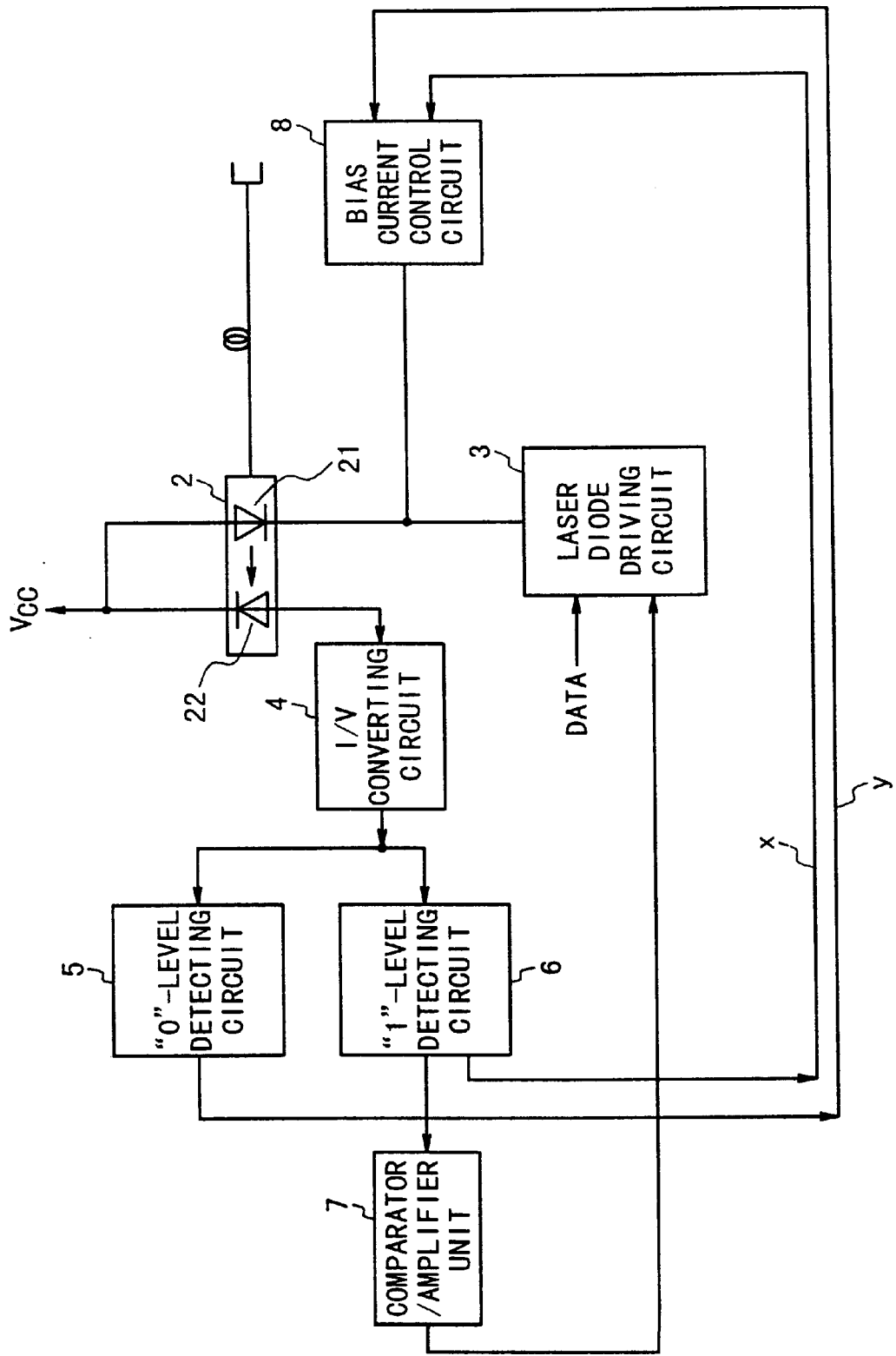
FIG. 3 is a schematic block diagram illustrating the structure of a laser diode driving apparatus according to an embodiment of the present invention.
Figure 4:
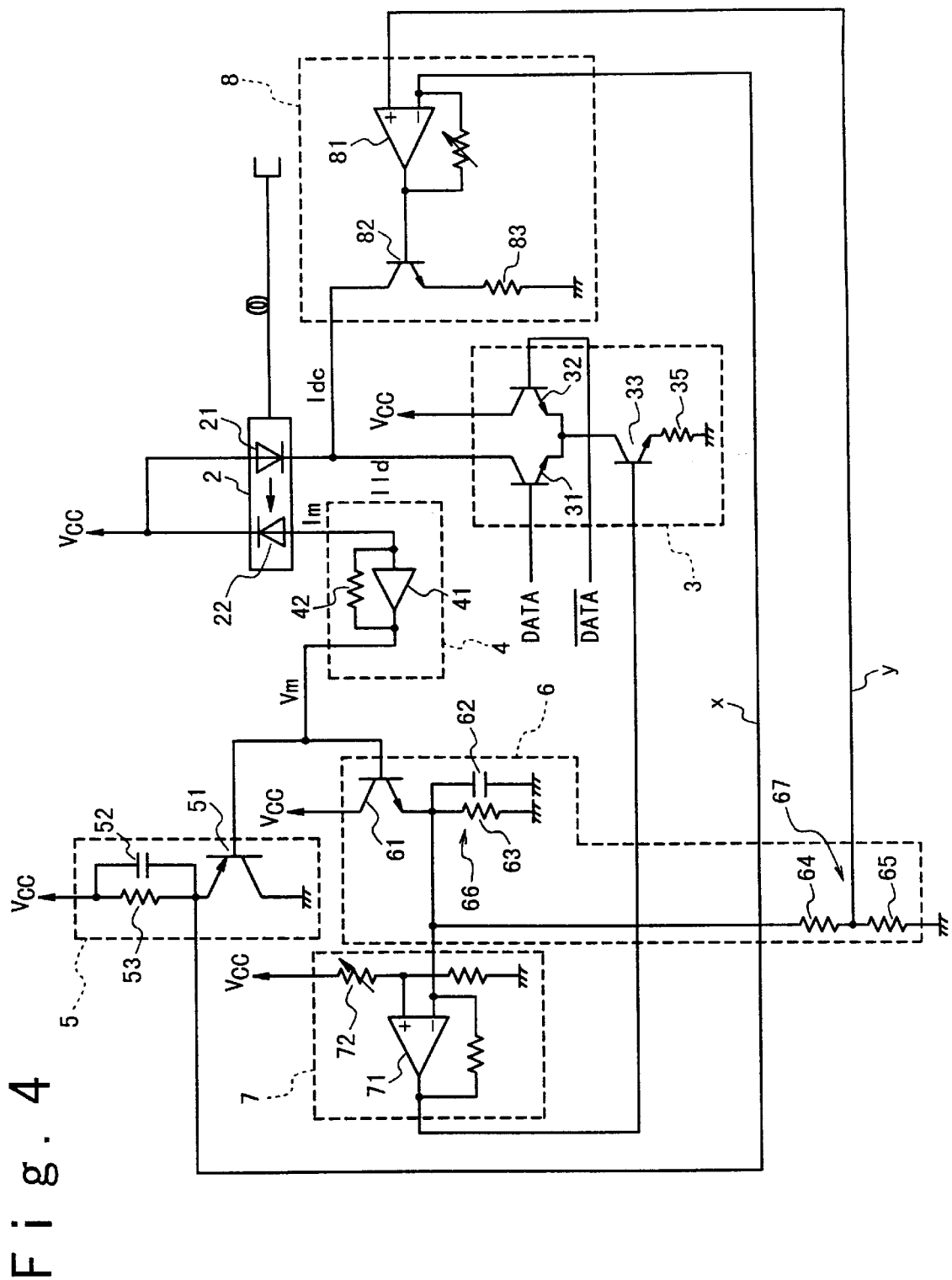
FIG. 4 is a circuit diagram for representing a specific circuit structure of the laser diode driving apparatus shown in FIG. 3.

Referring now to the accompanying drawings, a laser diode driving apparatus according to an embodiment of the present invention will be described. FIG. 3 is a schematic block diagram illustrating the structure of the laser diode driving apparatus according to this embodiment of the invention. FIG. 4 is a circuit diagram for representing a specific circuit structure of this laser diode driving apparatus.

As shown in FIG. 3, the laser diode driving apparatus 1 is composed of a laser diode module 2, a laser diode driving circuit 3, an I/V converting circuit 4, a "1"-level detecting circuit (corresponding to a first light output detecting circuit) 6, a "0"-level detecting circuit (corresponding to a second light output detecting circuit) 5, a comparator/amplifier unit (corresponding to a light output control circuit) 7, and bias current control circuit 8.

As indicated in FIG. 4, the laser diode module 2 contains a laser diode (LD) 21 and a photodiode (PD: light receiving element) 22. A power supply voltage Vcc is applied to the anode of the laser diode 21 and the cathode of the photodiode 22.

The laser diode driving circuit 3 is constructed of three transistors 31, 32 and 33. Any of these three transistors 31 to 33 are NPN type bipolar transistors. The transistors 31 to 33 constitute a differential amplifier circuit. A data signal "DATA" is supplied to a base of the transistor 31. A collector of this transistor 31 is connected to the cathode terminal of the laser diode 21. An inverted signal of the above-explained data signal DATA is inputted to a base of the transistor 32. The power supply voltage Vcc is applied to a collector of the transistor 32. Both emitters of these transistors 31 and 32 are connected to a collector of the transistor 33. An emitter of the transistor 33 is grounded via a resistor 35. A base of the transistor 33 is connected to an output terminal of the comparator/amplifier unit 7.

The I/V converting circuit 4 corresponds to, for instance, a trans-impedance amplifier, and is composed of an amplifier 41, and a resistor 42 connected in parallel to this amplifier 41. An input terminal of this I/V converting circuit 4 is connected to the anode terminal of the photodiode 22.

The "0"-level detecting circuit 5 is equipped with a transistor 51, a capacitor 52, and a resistor 53. This transistor 51 is a PNP type bipolar transistor. A base of the transistor 51 is connected to an output terminal of the I/V converting circuit 4. Both the capacitor 52 and the resistor 53 constitute a parallel circuit. When the charging operation and discharging operation are carried out in this "0"-level detecting circuit 5, the charging operation and discharging operation speed are influenced by a time constant defined by the capacitor 52 and the resistor 53. In other words, when the time constant is made small, the charging operation and discharging operation speed are fast. Conversely, when the time constant is made large, the charging operation and discharging operation speed are slow. A waveform of a signal outputted from the "0"-level detecting circuit 5 depends on a data rate of the data signal DATA, and the number of continuous same codes contained in this data signal in addition to the time constant. The parallel circuit of the capacitor 52 and the resistor 53 is connected to an emitter of the transistor 51. A collector of this transistor 51 is grounded.

The "1"-level detecting circuit 6 is equipped with a transistor 61, a capacitor 62, and three resistors 63, 64 and 65. These transistor 61, capacitor 62 and resistor 63 constitute a level detecting circuit 66 for detecting a peak level of the outputted voltage from the I/V converting circuit 4. The resistor 64 and the resistor 65 constitute a voltage dividing circuit 67. That is to say, the "1"-level detecting circuit 6 includes the level detecting circuit 66 and the voltage dividing circuit 67.

The transistor 61 is an NPN type bipolar transistor, the base of which is connected to the output terminal of the I/V converting circuit 4. The base of the transistor 61 is connected in parallel to the base of the transistor 51. The bases of these transistors 51 and 61 are connected to the output terminal of the I/V converting circuit 4. The power supply voltage Vcc is applied to a collector of the transistor 61. One terminal of the capacitor 62 and one terminal of the resistor 63 are both grounded. On the other hand, the other terminal of this capacitor 62 and the other terminal of this resistor 63 are both connected in parallel to an emitter of the transistor 61.

The resistor 64 is series-connected to the resistor 65 so as to constitute a series circuit whose one end is grounded and whose the other end is connected to the emitter of the transistor 61. In other words, the other end of this series circuit is connected to the emitter of the transistor 61 in parallel to the other end of the parallel circuit constituted by the capacitor 62 and the resistor 63. It should be understood that the charging operation and discharging operation are performed in the "1"-level detecting circuit 6, similar to the operation of the above-described "0"-level detecting unit 5. At that time, the charging operation and discharging operation speed are influenced by another time constant defined by the capacitor 62 and the resistor 63.

Also, the comparator/amplifier unit 7 corresponds to a negative feedback amplifier circuit with an operational amplifier 71. An inverting input terminal of this operational amplifier 71 is connected to the emitter of the transistor 61. The power supply voltage Vcc is applied via a variable resistor 72 to a non-inverting input terminal of the operational amplifier 71. An output terminal of this operational amplifier 71 is connected to the base of the transistor 33 of the laser diode driving circuit 3.

The bias current control unit 8 is composed of a negative feedback amplifier circuit using another operational amplifier 81, and an NPN type bipolar transistor 82. An inverting input terminal of this operational amplifier 81 is connected to the emitter of the transistor 51 of the "0"-level detecting circuit 5. A non-inverting input terminal of the operational amplifier 81 is connected to a node between the resistor 64 and the resistor 65 in the voltage dividing circuit of the "1"-level detecting circuit 6. An output terminal of this operational amplifier 81 is connected to a base of the transistor 82. An emitter of this transistor 82 is grounded via a resistor 83, and a collector thereof is connected to the cathode terminal of the laser diode 21.

Next, A description will now be made of operation of the laser diode driving apparatus having the above-described circuit structure.

First, when an "ON" data signal (corresponding to an ON signal) DATA is inputted to the base of the transistor 33 in the laser diode driving circuit 3, the laser diode 21 emits the laser light. Also, an "OFF" data signal (corresponding to an OFF signal) DATA is inputted to the base of the transistor 33, the laser diode 21 extinguishes the laser light emission in response to the data signals. When the laser diode 21 emits the laser light, the photodiode 22 outputs light reception current (monitor current) "Im" having a value proportional to the light output level from this laser diode 21. At this time, when the data signal DATA is equal to "1" (corresponding to an ON signal), the monitor current Im is increased, whereas when the data signal DATA is equal to "0" (corresponding to an OFF signal), the monitor current Im is decreased.

The monitor current Im outputted from the photodiode 22 is supplied to the I/V converting circuit 4. In this I/V converting circuit 4, the monitor current Im is I/V-converted into a corresponding monitor voltage "Vm" which is outputted from this I/V converting circuit 4. In this case, when the monitor voltage Vm outputted from this I/V converting circuit 4 is decreased, the transistor 51 of the "0"-level detecting circuit 5 is turned ON and also the transistor 61 of the "1"-level detecting circuit 6 is turned OFF. When the data signal DATA is equal to "1", the parallel circuit constructed of the above-described capacitor 52 and resistor 53 is charged, so that a voltage across between the capacitor 52 and the resistor 53 becomes the voltage Vm. Then, when the data signal DATA is equal to "0", this voltage Vm is lowered by the discharging operation in the "0"-level detecting circuit 5. Thereafter, the outputted voltage Vm is applied to the inverting input terminal of the operational amplifier 81 (output voltage at this time will be referred to as a symbol "x" hereinafter). On the other hand, when the monitor voltage Vm outputted from this I/V converting circuit 4 is increased, the transistor 51 of the "0"-level detecting circuit 5 is turned OFF and also the transistor 61 of the "1"-level detecting circuit 6 is turned ON. The parallel circuit constructed of the above-described capacitor 62 and resistor 63 is charged, so that a voltage across between the capacitor 62 and the resistor 63 becomes the voltage Vm. An output of the parallel circuit 62 and 63 corresponds to a peak level of a laser light outputted from the laser diode 21. An output of the level detecting circuit 66 (the parallel circuit 62 and 63) is supplied to the inverting input terminal of the operational amplifier 71.

Furthermore, at this time, the output voltage (namely, monitor voltage Vm) of the level detecting circuit 66 is divided by the voltage dividing circuit 67 constructed of the resistor 64 and the resistor 65. Then, a voltage (to be referred to as a "divided voltage y" hereinafter) divided by the voltage dividing circuit 67 is applied to the non-inverting input terminal of the operational amplifier 81.

In the operational amplifier 71, a reference voltage obtained from the power supply voltage Vcc by adjusting the variable resistor 72 is applied to the non-inverting input terminal thereof. Then, the comparator/amplifier unit 7 compares this reference voltage with the output voltage from the "1"-level detecting circuit 6. In response to this comparing result, the voltage appearing at the base of the transistor 33 in the laser diode driving circuit 3 is controlled in such a manner that the light output level produced when the "1" data signal DATA is inputted to this laser diode driving circuit 3 can be maintained at a substantially constant level.

In other words, for example, when the light output level of the laser diode 21 produced when the data signal DATA is equal to "1" is decreased due to the temperature variation of the laser diode 21, the output voltage of the "1"-level detecting circuit 6 is lowered. As a result, the output voltage of the comparator/amplifier unit 7 is increased. When the output voltage of the comparator/amplifier unit 7 is increased, the base voltage of the transistor 33 in the laser diode driving circuit 3 is increased, so that the collector current of this transistor 33 is increased. When the collector current of this transistor 33 is increased, a laser diode drive current Ild used to drive the laser diode 21 is also increased, so that the light output of the laser diode 21 is increased.

On the other hand, when the light output of the laser diode 21 produced when the data signal DATA is equal to "1" is increased, the laser diode driving apparatus operates in an opposite sense to the above-explained driving operation. That is, the laser diode drive current Ild is decreased, so that the light output from the laser diode 21 is decreased. As apparent from the foregoing descriptions, the light output from the laser diode 21 when the data signal DATA is equal to "1" can be kept constant by the comparator/amplifier 7.

Also, the output voltage of the level detecting circuit 66 in the "1"-level detecting circuit 6 is divided or converted based on a preset voltage dividing ratio of the voltage dividing circuit 67. Then, the divided voltage is applied as the reference voltage "y" to the bias current control unit 8. Since the value of the reference voltage "y" is set by using this voltage dividing ratio, the extinction ratio can be determined based on this voltage dividing ratio. That is, a magnitude of the current supplied for driving the laser diode 21 when the data signal DATA is equal to "1" is determined independently from the magnitude of the current supplied for driving the laser diode 21 when the data signal DATA is equal to "0". On the other hand, the magnitude of the current supplied to the laser diode 21 when the data signal DATA is equal to "0" is controlled independently of a magnitude of the current supplied to the laser diode 21 when the data signal DATA is equal to "1".

Then, the bias current control unit 8 compares this reference voltage or divided voltage "y" with the output voltage "x" from the "0"-level detecting circuit 5, and controls the bias current in such a manner that this potential difference of the comparing result can be maintained at a constant value.

In other words, if the light output of the laser diode 21 produced when the data signal DATA is equal to "0" is increased, namely, if extinction ratio is deteriorated, then the output voltage "x" of the "0"-level detecting circuit 5 is increased. As a consequence, since the potential difference between the output voltage "x" of the "0"-level detecting circuit 5 and the divided voltage "y" is decreased, the output from the operational amplifier 81 is reduced. As a result, the base potential of the transistor 82 is lowered, so that the collector current of this transistor 82 is decreased. When the collector current of the transistor 82 is reduced, the bias current Idc is decreased. Therefore, increasing of the light output from the laser diode 21 produced when the data signal DATA is equal to "0" can be suppressed. Thus, the deterioration of the extinction ratio of the laser diode 21 can be avoided.

In this manner, one of the features of the laser diode driving operation is given as follows. The laser diode drive current Ild is controlled in accordance with the above-explained operation of the comparator/amplifier 7, so that the light output level of the laser diode 21 produced when the data signal DATA is equal to "1" can be kept constant. Accordingly, the divided voltage "y" can be maintained at a constant value, which may constitute the reference voltage "y". As a result, the varied (increased) output voltage of the "0"-level detecting circuit 5 directly becomes the varied value (reduced value) of the potential difference with respect to the divided voltage (reference voltage) "y". As a consequence, the bias current control unit 8 can control the bias current Idc in such a manner that the above-described potential difference can be maintained at a constant value, which can prevent the extinction ratio of the laser diode 21 from being deteriorated.

This laser diode driving apparatus according to the embodiment can detect the peak level of the laser light output when the laser light is emitted from the laser diode 21 (namely, in case of "1" data signal), and also can detect the peak level of the laser light when the laser light is extinguished from the laser diode 21 (namely, in case of "0" data signal, laser light is emitted from laser diode by receiving only the bias current Idc). Thus, this laser diode driving apparatus can execute such a control operation (negative feedback control) that the level difference (potential difference) between these peak levels can be kept constant.

As previously described, the bias current control unit 8 can maintain the difference between the divided voltage "y" and the output voltage "x" at a constant value, which is equivalent to such a fact that the extinction ratio of the laser diode 21 can be kept constant. This divided voltage "y" is produced from the output voltage of the level detecting circuit 66 in the "1"-level detecting circuit 6. This output voltage "x" is derived from the "0"-level detecting circuit 5. Since the light output levels of the laser diode 21 driven based on both "1" data signal and "0" data signal are respectively maintained at constant values by the laser diode driving circuit 3, the deterioration of the extinction ratio can be avoided.

It should be understood that the voltage dividing circuit 67 constituted by the resistor 64 and the resistor 65 is contained in the "1"-level detecting circuit 6 in the above-described embodiment. Alternatively, this voltage dividing circuit 67 may be independently interposed between the "1"-level detecting circuit 6 and the bias current control unit 8, otherwise may be involved in this bias current control unit 8.

As a first effect of the present invention, the extinction ratio can be kept constant irrelevant to the change in ambient temperature and the aging deterioration of the laser diode. This reason is given as follows. The light output level produced when the laser light is emitted from the laser diode 21 driven based on "1" signal is monitored by the "1"-level detecting circuit 6, and also the light output level produced when the laser light is emitted from the laser diode 21 driven based on "0" signal is monitored by the "0"-level detecting circuit 5. Therefore, the level difference of these light output levels can be maintained at a constant value by the bias current control unit 8.

As a second effect of the present invention, the control operation can be readily performed without employing two the laser diodes 21. This is because one of the light output levels produced respectively when the laser light is emitted from the laser diode 21 driven based on both "0" signal and "1" signal can be controlled independently from the other of them. As a consequence, the control operation can be carried out without considering the threshold value characteristic of the laser diode 21.

What is claimed is:

1. An apparatus for driving a laser diode comprising:
a light receiving element for detecting a light output level from said laser diode to produce an electric signal, wherein said light receiving element producing a first electric signal from the light output level from said laser diode driven based upon an ON signal, and a second electric signal from the light output level from said laser diode driven based upon an OFF signal;
a control circuit for outputting a control signal in response to said first and second electric signals; and
a driving circuit for driving said laser diode in response to said control signal such that said first electric signal and said second electric signal maintains at substantially constant values, respectively.

2. An apparatus according to claim 1, wherein said control circuit outputs first and second control signal as said control signal in response to said first and second electric signals, and
wherein said driving circuit first and second driving circuits, and
wherein said first driving circuit drives said laser diode in response to said first control signal such that a difference between said first electric signal and said second electric signal is maintained at a substantially constant value, and
wherein said second driving circuit drives said laser diode in response to said second control signal such that said second electric signal is maintained at a substantially constant value.

3. An apparatus according to claim 2, wherein said control circuit includes a light output control circuit for comparing said first electric signal with a reference signal to output said second control signal based on the comparing result.

4. An apparatus according to claim 1, wherein said control circuit includes a circuit for outputting first and second light output detection signals as said control signal from said first and second electric signals from said light receiving element, respectively, and
wherein said driving circuit includes a circuit for comparing said first light output detection signal with said second light output detection signal to produce the comparing result, and controls a magnitude of drive current supplied to said laser diode based on said comparing result.

5. An apparatus according to claim 4, wherein said control circuit outputs said first light output detection signal based on a maximum value of said first electric signal and said second light output detection signal based on a maximum value of said second electric signal.

6. An apparatus according to claim 4, wherein said control circuit includes a first light output detecting circuit and a second light output detecting circuit, and
wherein said first light output detecting circuit includes:
a first transistor which is turned ON when said first electric signal is inputted to said first transistor, and which is turned OFF when said second electric signal is inputted to said first transistor, and
a first RC circuit connected to said first transistor, and composed of a first resistor and a first capacitor connected in parallel, said first capacitor being charged and discharged when said first transistor is turned ON and OFF, respectively, to output said first light output detection signal based on the maximum value of said first electric signal; and
wherein said second light output detecting circuit includes:
a second transistor which is turned ON when said second electric signal is inputted to said first transistor, and which is turned OFF when said first electric signal is inputted to said first transistor, and
a second RC circuit connected to said second transistor, and composed of a second resistor and a second capacitor connected in parallel, said second capacitor being charged and discharged when said second transistor is turned ON and OFF, respectively, to output said second light output detection signal based on the maximum value of said second electric signal.

7. An apparatus for driving a laser diode comprising:
a light receiving element for detecting a light output level of said laser diode to produce an electric signal, wherein said light receiving element detects a first electric signal when said laser diode is driven based upon an ON signal, and a second electric signal when said laser diode is driven based upon an OFF signal;
a high level data producing unit for converting a data corresponding to said first electric signal into a high level data in accordance with a setting ratio, wherein said setting ratio is set in relation to an EXTINCTION ratio of said laser diode;
a low level data producing unit for producing a low level data from said second electric signal;
a control circuit for comparing said high level data with said low level data to output a control signal based on the comparing result; and
a driving circuit for driving said laser diode in response to said control signal such that a difference between said first electric signal and said second electric signal is maintained at a constant value.

8. An apparatus according to claim 7, wherein said high level data producing unit includes:
a first transistor which is turned ON when said first electric signal is inputted to said first transistor, and which is turned OFF when said second electric signal is inputted to said first transistor;
a first RC circuit connected to said first transistor, and composed of a first resistor and a first capacitor connected in parallel, said first capacitor being charged and discharged when said first transistor is turned ON and OFF, respectively, to produce said data corresponding to said first electric signal; and
a second resistor connected to said first RC circuit, for converting said corresponding data into said high level data, and
wherein said low level data producing unit includes:
a second transistor which is turned ON when said second electric signal is inputted to said second transistor, and which is turned OFF when said first electric signal is inputted to said second transistor; and
a second RC circuit connected to said second transistor, and composed of a third resistor and a second capacitor connected in parallel, said second capacitor being charged and discharged when said second transistor is turned ON and OFF, respectively, to produce said low level data corresponding to said second electric signal.

9. An apparatus for driving a laser diode comprising:

a light receiving element for detecting a light output level of said laser diode to produce an electric signal, wherein said light receiving element detects a first electric signal when said laser diode is driven based upon an ON signal and detects a second electric signal when said laser diode is driven based upon an OFF signal;

a first light output detecting circuit for outputting a first light output detection signal from said first electric signal;

a second light output detecting circuit for outputting a second light output detection signal from said second electric signal; and a driving circuit for comparing said first light output detection signal with said second light output detection signal to produce the comparing result, and for controlling a magnitude of drive current supplied to said laser diode based on said comparing result such that a difference between said first electric signal and said second electric signal is maintained at a substantially constant value.

10. An apparatus according to claim 9 wherein said first light output detecting circuit further comprises a light output control circuit for comparing said first electric signal with a reference signal to output a light output control signal based on the comparing result, and wherein said driving circuit includes a first and second driving circuit, wherein said first driving circuit drives said laser diode based on said comparing result of said first light output detection signal with said second light output detection signal, and wherein said second driving circuit drives said laser diode based on said comparing result of said first electric signal with said reference signal.

11. A method for driving a laser diode, comprising the steps of:

detecting a light emitted from said laser diode when said laser diode is driven based on a signal including an ON data signal and an OFF data signal, to produce an electric signal, said signal;

outputting first and second control signal in response to said electric signal such that light intensity levels from said laser diode for said ON data signal and OFF data signal have predetermined levels, respectively; and driving said laser diode in response to said first and second control signal.

12. A method according to claim 11, wherein said driving step includes controlling a magnitude of bias current supplied to said laser diode in response to said first and second control signal.

13. A method according to claim 11, wherein said driving step includes:

comparing said first electric signal with a reference signal to produce said second control signal based on the comparing result; and driving said laser diode based on said control signal such that said first electric signal is maintained at a constant value.

14. A method for driving a laser diode, comprising the steps of:

detecting a first electric signal from a light emitted from said laser diode driven based upon ON signal;

detecting a second electric signal from a light emitted from said laser diode driven based upon OFF signal;

comparing said first electric signal with said second electric signal to output a first control signal;

controlling a magnitude of bias current supplied to said laser diode based on said first control signal such that a difference between said first electric signal and said second electric signal is maintained at a constant value.

15. A method according to claim 14, further comprising the step of:

comparing said first electric signal with a reference signal to produce a second control signal; and driving said laser diode based on said second control signal such that said first electric signal is maintained at a constant value.

16. A method according to claim 14, wherein each of said detecting steps includes detecting a maximum value of said first electric signal and a maximum value of said second electric signal.

17. A method for driving a laser diode, comprising the steps of:

detecting a first electric signal from a light emitted from said laser diode driven based upon ON signal;

converting data corresponding to said first electric signal into a high level data in accordance with a setting ratio, wherein said setting ratio is set in relation to an EXTINCTION ratio of said laser diode;

detecting a second electric signal from a light emitted from said laser diode driven based upon OFF signal;

outputting data corresponding to said second electric signal as low level data;

comparing said high level data with said low level data to produce a first control signal based upon the comparing result; and driving said laser diode in response to said first control signal such that a difference between said high level data and said low level data is maintained at a substantially constant value.

18. A method according to claim 17, further comprising the step of:

comparing said high level data with a reference signal to produce a second control signal; and driving said laser diode based on said second control signal such that said first electric signal is maintained at a constant value.

19. A method for driving a laser diode, comprising the steps of:

receiving light outputted from said laser diode;

outputting a light level from said laser diode driven based upon an ON signal and a light level from said laser diode driven based upon an OFF signal as a voltage value;

dividing a voltage indicating said light level when said laser diode is driven based upon said ON signal in accordance with a voltage dividing ratio to produce a voltage divided value, wherein said voltage dividing ratio is set in relation to an EXTINCTION ratio of said laser diode;

outputting a high level data from said voltage divided value;

outputting, as a low level data, a voltage indicating said light level when said laser diode is driven based upon said OFF signal;

comparing said high level data with said low level data to produce a first control signal based upon the comparing result; and driving said laser diode in response to said control signal such that a difference between said high level data and said low level data is maintained at a constant value.

* * * * *